United States Patent
Cervantes et al.

(10) Patent No.: US 7,856,582 B2
(45) Date of Patent: *Dec. 21, 2010

(54) TECHNIQUES FOR LOGIC BUILT-IN SELF-TEST DIAGNOSTICS OF INTEGRATED CIRCUIT DEVICES

(75) Inventors: Daniel W. Cervantes, Round Rock, TX (US); Robert B. Gass, Pflugerville, TX (US); Joshua P. Hernandez, Paige, TX (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 293 days.

This patent is subject to a terminal disclaimer.

(21) Appl. No.: 12/061,752

(22) Filed: Apr. 3, 2008

(65) Prior Publication Data

US 2009/0254788 A1    Oct. 8, 2009

(51) Int. Cl.
*G01R 31/28* (2006.01)
*G01R 31/02* (2006.01)
*G01R 31/26* (2006.01)

(52) U.S. Cl. .............. 714/732; 714/724; 714/726; 714/729; 714/733; 714/736; 714/738; 714/739; 714/742; 324/759; 324/763; 324/765

(58) Field of Classification Search ............ 714/724, 714/726, 729, 732, 733, 736, 738, 739, 742; 324/759, 763, 765

See application file for complete search history.

(56) References Cited

U.S. PATENT DOCUMENTS

| | | | | |
|---|---|---|---|---|
| 6,901,542 | B2 * | 5/2005 | Bartenstein et al. | 714/719 |
| 6,976,199 | B2 | 12/2005 | Berry, Jr. et al. | |
| 6,993,694 | B1 * | 1/2006 | Kapur et al. | 714/733 |
| 7,032,148 | B2 * | 4/2006 | Wang et al. | 714/729 |
| 7,279,918 | B2 * | 10/2007 | Marr | 324/763 |
| 7,627,798 | B2 * | 12/2009 | Kiryu | 714/733 |
| 7,673,205 | B2 * | 3/2010 | Miyake et al. | 714/729 |
| 7,681,098 | B2 * | 3/2010 | Kiryu | 714/733 |
| 2007/0033468 | A1 | 2/2007 | Hilgendorf et al. | |
| 2007/0168809 | A1 * | 7/2007 | Kiryu et al. | 714/733 |
| 2008/0092003 | A1 * | 4/2008 | Khoche et al. | 714/733 |

* cited by examiner

*Primary Examiner*—John J Tabone, Jr.
(74) *Attorney, Agent, or Firm*—Dillon & Yudell LLP

(57) ABSTRACT

A method, system and computer program product for performing real-time LBIST diagnostics of IC devices. During LBIST, stump data and identifiers of test cycles are saved in the IC device-under-test (DUT). If compressed stump data does not match a pre-defined coded value (i.e., "signature" of the test cycle), the saved stump data and an identifier of the failed test cycle are preserved, otherwise the determination is made the DUT passed the test cycle. Identifiers and stump of the failed test cycles are used to analyze errors, including virtually non-reproducible errors.

20 Claims, 3 Drawing Sheets

TECHNIQUES FOR LOGIC BUILT-IN SELF-TEST DIAGNOSTICS OF INTEGRATED CIRCUIT DEVICES

BACKGROUND

1. Technical Field

The present invention generally relates to integrated circuit devices and in particular to techniques for Logic Built-In Self-Test (LBIST) diagnostics of integrated circuit devices.

2. Description of the Related Art

As complexity of integrated circuit (IC) devices increases, testing of the IC devices during manufacture thereof and during operation has become increasingly more important. LBIST diagnostics is based on computerized comparative analysis of actual test data generated by an IC device-under-test (DUT) versus a plurality of correct test patterns ("signatures") obtained from a properly functioning IC device. When the test data of the DUT and the signatures match, the DUT passes the LBIST; otherwise the DUT is considered to be defective.

While the LBIST is an efficient tool for detecting many types of defects in IC devices, LBIST diagnostics is only effective for defects that manifest themselves on a subsequent LBIST, which is specially configured to stop on the cycles that lock the unexpected test data for subsequent analysis. Some failures in the DUTs may be missed or misidentified due to temporal nature of the currently used LBIST diagnostics, and additional testing may be needed for the failed IC devices. Such difficult to diagnose failures include, for example, sparse error events such as non-cyclical, non-reproducible, and speed-of-test dependent types of failures. Conventional techniques of LBIST diagnostics do not allow for real time identification of error conditions, and time-consuming repetitive execution of test cycles may be required to capture sparse failures. The drawbacks of such techniques limit effectiveness of LBIST diagnostics in the IC devices.

SUMMARY OF ILLUSTRATIVE EMBODIMENTS

Disclosed are a method, system, and a computer program product for performing real-time, LBIST diagnostics of integrated circuit (IC) devices.

In embodiments of the present invention, during a test cycle of LBIST diagnostics, stump data of scan chains of an IC device-under-test (DUT) and identifiers of the test cycle are saved. If a bit word representing the stump data (e.g., compressed stump data) does not match a pre-defined coded value (i.e., "signature" of the test cycle), the determination is made that the DUT failed the test cycle, and then the saved stump data and an identifier of the failed test cycle are preserved. If the bit word matches the pre-defined coded value, the determination is made that the DUT passed the test cycle. After completion of the LBIST, the saved (i.e., preserved) identifiers of failed test cycles and the stump data thereof are used to analyze errors, including virtually non-reproducible errors.

The above as well as additional features and advantages of the present invention will become apparent in the following detailed written description.

BRIEF DESCRIPTION OF THE DRAWINGS

The invention itself will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
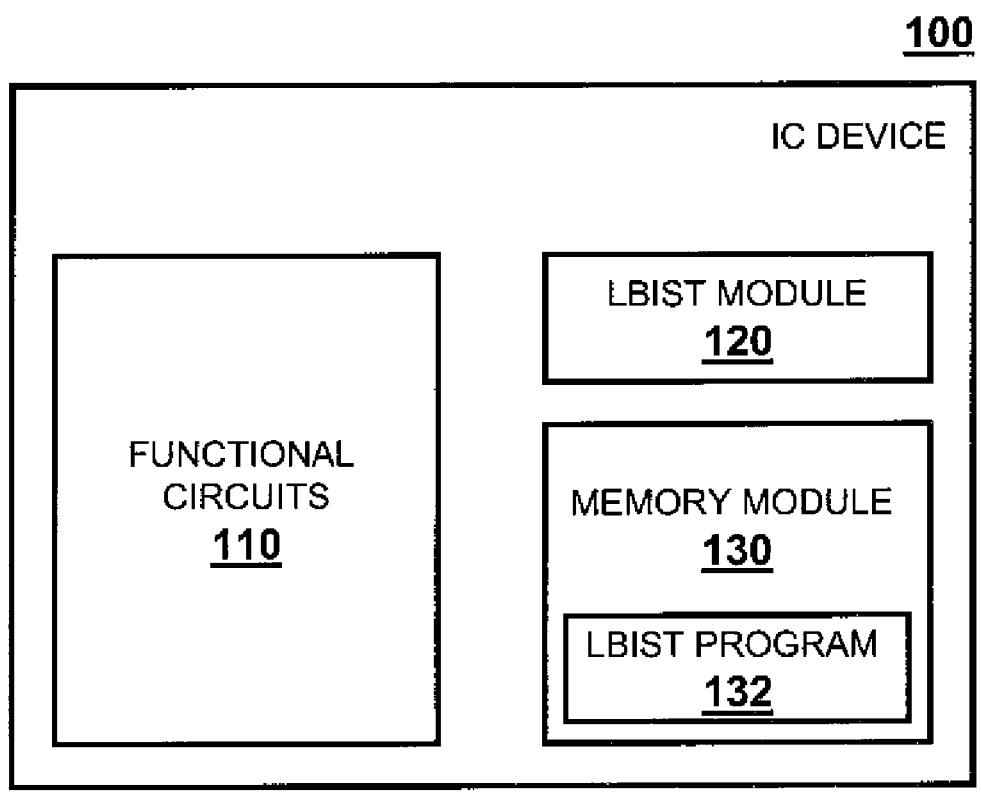
FIG. 1 is a block diagram of an exemplary integrated circuit (IC) device having a system of LBIST diagnostics having hardware and software components configured for implementing one or more embodiments of the invention.

The illustrative embodiments provide a method, system, and computer program product for LBIST diagnostics of integrated circuit (IC) devices.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical, and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s), except that suffixes may be added, when appropriate, to differentiate such elements. Where a later figure utilizes the element in a different context or with different functionality, the element is provided a different leading numeral representative of the figure number (e.g., 120 in FIG. 1 and 220 in FIG. 2). The specific numerals assigned to the elements are provided solely to aid in the description and not meant to imply any limitations (structural or functional) on the invention.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. Specifically, as utilized herein, the term "LBIST" broadly refers to hardware/software products at least in part facilitating Logic Built-In Self-Test diagnostics in an IC device.

With reference now to the figures, FIG. 1 depicts a block diagram representation of exemplary IC device 100 including functional circuits 110, LBIST module 120, and memory module 130 containing, among other software products, a code of LBIST program 132. Together, LBIST module 120 and LBIST program 132 form LBIST system 202 (shown in FIG. 2) of IC device 100.

IC device 100 (which is also referred to herein as device-under-test, DUT) may, for example, be a microprocessor, an application-specific IC (ASIC), a field-programmable array (FPA), or a memory array, among other types of IC devices. Correspondingly, memory module 130 may include, but is not limited to, cache memory, random access memory (RAM), read only memory (ROM), firmware memory devices, registers, and buffers, among other storage elements. Functional circuits 110, memory module 130, and LBIST module 120 are connected to one another and to external circuits by interfaces and/or busses (not shown) provided in IC device 100. In alternate embodiments, LBIST module 120, LBIST program 132, or both, may be associated with apparatuses external to IC device 100.

LBIST program 132 is illustrated and described herein as a stand-alone (i.e., separate) software/firmware component, which is saved in memory module 130 and provides or supports the specific novel functions discussed below. In alternate embodiments, at least portions of LBIST program 132 may be combined with other software modules incorporating functionality of their respective components.

In one illustrative embodiment, LBIST program 132 facilitates in-situ simulation and diagnostics (i.e., testing) of temporal behaviour and/or spatial characteristics of circuit structure of electronic components of IC device 100. In particular, syntax of LBIST program 132 allows testing of combinational, sequential, memory, and other circuits used in IC devices.

Among the software code/instructions provided by LBIST program 132 and which are specific to the invention, are: (i) code for saving stump data of the scan chains of the IC device 100 and an identifier of a test cycle of the LBIST; (ii) code for preserving the saved stump data and the identifier of the test cycle for which compressed stump data does not match a pre-defined coded value (e.g., coded value previously sampled and recorded at passing conditions), and (iii) code for determining that the IC device 100 passed the test cycle if the compressed stump data matches the pre-defined coded value.

For simplicity of the description, the collective body of the code that enables these various features is referred to herein as LBIST program 132. According to the illustrative embodiment, when IC device 100 executes LBIST program 132, LBIST system 202 initiates a series of functional processes that enable the above functional features, as well as additional features/functionalities that are described below within the context of FIGS. 2 and 3.

Figure 2:
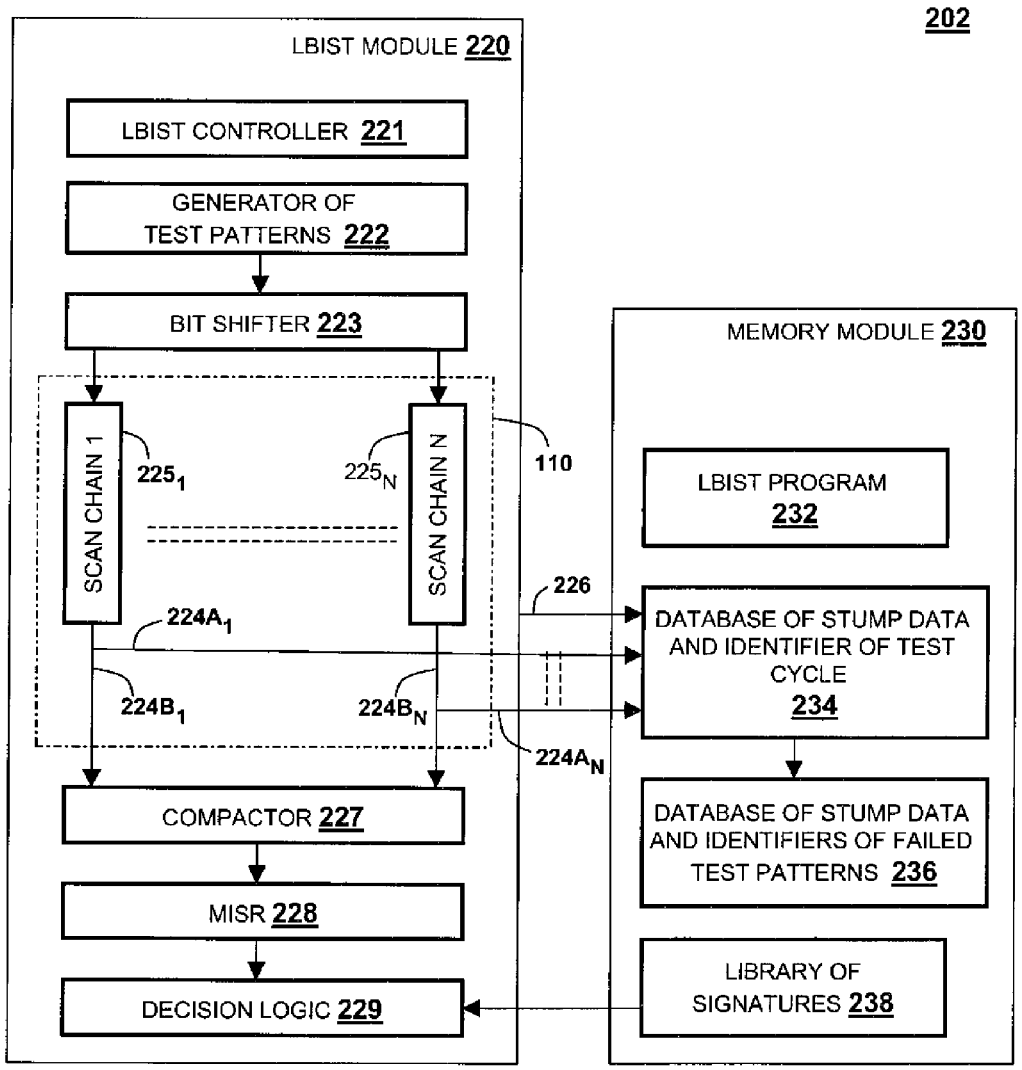
FIG. 2 is a functional block diagram of a system of LBIST diagnostics in which the features of the invention are implemented, according to one embodiment of the invention.

Those of ordinary skill in the art will appreciate that hardware and software configurations depicted in FIGS. 1 and 2 may vary. For example, other hardware or software components may be used in addition to or in place of the depicted components. The IC device 100 depicted in FIG. 1 (referred to hereinafter as DUT) may, for example, be a portion of a larger IC device or a system-on-chip (SoC), system-in-package (SiP), and system-in-module (SiM) device, as well as may incorporate some of such devices or elements thereof. Therefore, the architecture depicted in FIG. 1 is a basic illustration of an IC device, for which actual implementations may vary. Thus, the depicted example is not meant to imply architectural limitations with respect to the present invention.

Figure 3:
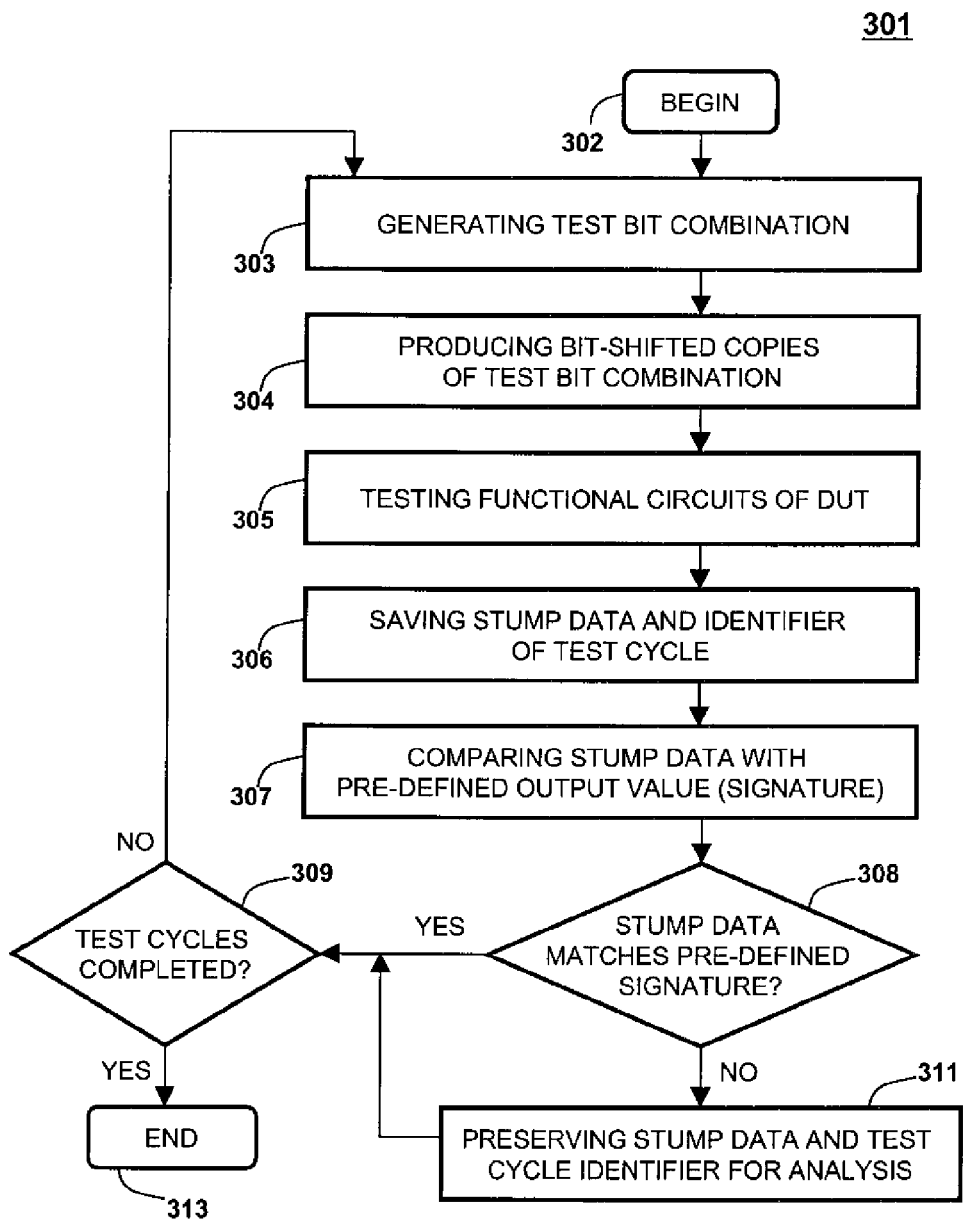
FIG. 3 illustrates a flow chart of a process by which the features of the invention are implemented, according to one embodiment of the invention.

With reference now to FIGS. 2 and 3, therein are described illustrative embodiments of the invention. FIG. 2 illustrates a high-level block diagram of LBIST system 202, in which an embodiment of the invention is implemented, and FIG. 3 is a flow chart illustrating process 301 by which methods of the illustrative embodiments are completed. Although the features illustrated in FIGS. 2 and 3 may be described with reference to components shown in FIG. 1, it should be understood that this is merely for convenience and alternative components and/or configurations thereof can be employed when implementing embodiments of the invention.

Referring to FIG. 2, LBIST system 202 of IC device-under-test (DUT) 100 (FIG. 1) comprises LBIST module 220 and memory module 230. LBIST module 230 includes the following functional modules: LBIST controller 221, generator 222 of test patterns (i.e., test bit combinations), shifter 223, scan chains 225, compactor 227, multi-input signature register (MISR) 228, and decision logic 229. Memory module 230 comprises the following functional modules: LBIST program 232, first database 234 of stump data and identifiers of test cycles, second database 236 of stump data and identifiers of failed test cycles, and library 238 of pre-defined coded values commonly referred to as "signatures". Methods for determining the signatures include recording them during execution of the LBIST on an operational IC device of the same type as the one being diagnosed.

LBIST controller 221 includes control circuitry that administers the operation of other modules of LBIST system 202 and, typically, is coupled (not shown) to each of the other modules. In operation, generator 222 produces pseudorandom or deterministic test patterns (i.e., test bit combinations), which are processed by shifter 223. While not essential to the LBIST architecture, shifter 223 improves the operation of LBIST system 202 by further randomizing test patterns.

The scan chains 225 (N scan chains 225 are shown) are defined by designers of DUT 100 as representative inputs/outputs for testing operational performance of functional circuits 110 of the device. Typically, scan chains 225 are positioned before and after (i.e., interposed with) respective portions of functional circuits 110 in a manner providing that for each portion of circuits 110 there is a preceding scan chain 225 providing inputs to the components thereof, as well as a following scan chain 225, which receives the outputs of the portion.

In one embodiment, shifter 223 comprises a linear feedback shift register (LFSR) that produces a plurality of bit-shifted copies of a test pattern selectively inputted in scan chains 225 of DUT 100. During a test cycle, the inputted bit sequences in adjacent scan chains 225 may be the same, but shifted up or down by one bit. Essentially, LFSR operates by shifting the phase of a test bit combination in a succeeding scan chain 225 with respect to the preceding scan chain and, therefore, such test bit combinations are clearly identifiable.

After the inputted test bit combinations have propagated through components of functional circuits 110, outputs of scan chains 225 and an identifier of a particular test pattern (i.e., identifier of a particular test cycle of the LBIST) are saved in first database 234 and the outputs of scan chains 225 are provided to compactor 227. Output signals of scan chains 225 are commonly referred to as "stump data". The identifier of the test pattern may be a bit word or a numerical value (e.g., number) assigned by, for example, by LBIST controller 221. In the depicted embodiment, stump data from scan chains 225 and the identifier of a test cycle are provided to first database 234 via interfaces 224A and 226, and the stump data is forwarded to compactor 227 via interfaces 224B, respectively.

Compactor 227 compresses the stump data to reduce an amount of information to be processed by MISR 228. Generally, compactor 227 employs XOR gates or more complex data-compressing circuitry. Typically, MISR 228 is configured to compare a cumulative value of the output signals of compactor 227 (i.e., compressed stump data) with pre-defined, or expected, coded values for the test cycles of the LBIST. Such pre-defined coded values, or signatures, are stored in library 238.

If the cumulative value matches the test cycle's signature, DUT 100 passes the test cycle of the LBIST, otherwise the DUT 100 fails the test cycle. When decision logic 229 determines that IC device failed a particular test cycle of the LBIST, the stump data and the identifier of the failed cycle are moved to second database 236 and preserved for further analysis, for example, circuit simulation analysis. In one embodiment, second database 236 is a virtual database, and collected stump data may be moved to such a database by changing a pointer to the data. Contents of second database 236 may be read out from DUT 100 via, for example, a JTAG (Joint Test Action Group) interface of the device.

Referring to FIG. 3, key portions of process 301 may be completed by LBIST program 132 executed in DUT 100 and controlling specific operations of/in LBIST system 202, therefore the process 301 is described below in the context of either/both DUT 100 and LBIST system 202. To best understand the invention, the reader should refer to FIGS. 2 and 3 simultaneously.

The process 301 of FIG. 3 begins at block 302, at which LBIST program 132 initiates the LBIST. At block 303, a test bit combination ("test pattern") of a test cycle of the LBIST is produced by generator 222. At block 304, the test bit combination is processed by shifter 223 that forms bit-shifted copies of the test bit combination. At block 305, the bit-shifted copies of the test bit combination are selectively inputted in scan chains 225 of DUT 100 to test elements of functional circuits 110 (shown in FIG. 1) of DUT 100.

At block 306, stump data (i.e., output data) of scan chains 225 and an identifier of the test cycle are saved in first database 234 and the stump data is provided to compactor 227, which compresses the stump data and forwards the compressed stump data to MISR 228. The identifier of the test pattern may be in a form of a pre-defined bit word or pre-defined numerical value. In one embodiment, the stump data, the identifier of the test pattern, or both are saved in first database 234 using a compressed data format.

At block 307, at MISR 228 the compressed stump data is compared with a pre-defined signature (coded value) of the test cycle. The signature is obtained from library 238 and corresponds to the test bit combination produced at preceding block 303.

Block 308 is a decision block where process 301 queries if the compressed stump data matches the pre-defined signature of the test cycle. Alternatively, the signature of the test cycle may be compared with a cumulative value of the compressed stump data. If the query is negatively answered, the process 301 proceeds to block 311. At block 311, the stump data and identifier of the failed test cycle are preserved in memory module 130. For example, the stump data and identifier of the failed test cycle are copied from first database 234 and saved in second database 236. Alternatively, the stump data and identifier of the failed test cycle may be saved in library 238 of signatures of test cycles of the LBIST. If the query is positively answered, the process 301 proceeds to block 309.

At block 309, process 301 queries if all pre-selected test cycles of LBIST diagnostics have been completed. If the query is negatively answered, the process 301 proceeds back to block 303, where a test bit combination of following LBIST cycle is produced. In one embodiment, the stump data and the identifier of a passed (i.e., successful) preceding test cycle are replaced (e.g., rewritten) with such information from the following test cycle of the LBIST. If the query is positively answered, process 301 proceeds to block 313, where process 301 ends. Upon completion of process 301, stump data and identifiers of the failed test cycles, which have been accumulated in block 311, are preserved in DUT 100 and may be accessed for further analysis.

In the flow chart in FIG. 3, one or more of the methods are embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be further appreciated, the processes in embodiments of the present invention may be implemented using any combination of software, firmware or hardware. As a preparatory step to practicing the invention in software, the programming code (whether software or firmware) will typically be saved in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional IC device with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non-exclusive list of types of media includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method of performing Logic Built-In Self-Test (LBIST) in an integrated circuit (IC) device, the method comprising:

storing in memory an identifier of a test cycle of the LBIST and stump data of scan chains of the IC device; and determining by logic whether a compressed form of the stump data matches a pre-defined coded value;

if the compressed form of the stump data does not match the pre-defined coded value, then (i) determining that the IC device failed the test cycle and (ii) preserving the stored stump data and identifier of the test cycle that caused the IC device to fail; or if the compressed form of the stump data matches the pre-defined coded value, determining that the IC device passed the test cycle, wherein the identifier of the test cycle is associated with a particular test pattern for enabling subsequent analysis of sparse error data.

2. The method of claim 1, further comprising:
replacing the stump data and the identifier of the test cycle that produced a match with the pre-defined coded value with a stump data and an identifier of a following test cycle of the LBIST.

3. The method of claim 1, further comprising:
saving the stump data and the identifier of the test cycle in a library of pre-defined coded values.

4. The method of claim 1, further comprising:
saving at least one of the stump data and the identifier of the test cycle using a compressed data format.

5. The method of claim 1, wherein the identifier of the test cycle is one of a bit word or a numerical value.

6. The method of claim 1, further comprising:
reading out the stored stump data and the identifier of the test cycle that caused the IC device to fail via an interface of the IC device.

7. The method of claim 6, further comprising:
performing circuit simulation analysis using the stored stump data and the identifier of the test cycle that was read out from the interface of the IC device.

8. An integrated circuit (IC) device, comprising:
one or more functional circuits;
a system for performing Logic Built-In Self-Test (LBIST) of the one or more functional circuits; and
a memory including a library of pre-defined coded values and containing a code of a program that performs operations including:
storing in memory an identifier of a test cycle of the LBIST and stump data of scan chains of the IC device; and
determining by logic whether a compressed form of the stump data matches a pre-defined coded value;
if the compressed form of the stump data does not match the pre-defined coded value, then (i) determining that the IC device failed the test cycle and (ii) preserving the stored stump data and identifier of the test cycle that caused the IC device to fail; or
if the compressed form of the stump data matches the pre-defined coded value, determining that the IC device passed the test cycle.
wherein the identifier of the test cycle is associated with a particular test pattern for enabling subsequent analysis of sparse error data.

9. The IC device of claim 8, said device configured to replace the stump data and the identifier of the test cycle that produced a match with the pre-defined coded value with a stump data and an identifier of a following test cycle of the LBIST.

10. The IC device of claim 8, said device configured to save the stump data and the identifier of the test cycle in the library of pre-defined coded values.

11. The IC device of claim 8, wherein at least one of the stump data and the identifier of the test cycle is saved using a compressed data format.

12. The IC device of claim 8, wherein the identifier of the test cycle is one of a bit word or a numerical value.

13. The IC device of claim 8, further comprising an interface for reading out the stored stump data and the identifier of the test cycle that caused the IC device to fail.

14. A non-transitory computer readable medium having a computer program product performing Logic Built-In Self-Test (LBIST) diagnostics in an integrated circuit (IC) device, said computer readable medium comprising:
computer program code for storing in memory an identifier of a test cycle of the LBIST and stump data of scan chains of the IC device; and
computer program code for determining by logic whether a compressed form of the stump data matches a pre-defined coded value;
computer program code for preserving the stored stump data and identifier of the test cycle in which the compressed form of the stump data does not match the pre-defined coded value; and
computer program code for, if the compressed form of the stump data does not match the pre-defined coded value, (i) determining that the IC device failed the test cycle; and (ii) preserving the stored stump data and identifier of the test cycle that caused the IC device to fail; and
computer program code for determining that the IC device passed the test cycle if the compressed form of the stump data matches the pre-defined coded value.
wherein the identifier of the test cycle is associated with a particular test pattern for enabling subsequent analysis of sparse error data.

15. The non-transitory computer readable medium of claim 14, further comprising:
computer program code for replacing the stump data and the identifier of the test cycle that produced a match with the pre-defined coded value with a stump data and an identifier of a following test cycle of the LBIST.

16. The non-transitory computer readable medium of claim 14, further comprising:
computer program code for saving the stump data and the identifier of the test cycle in a library of pre-defined coded values.

17. The non-transitory computer readable medium of claim 14, further comprising:
computer program code for saving at least one of the stump data and the identifier of the test cycle using a compressed data format.

18. The non-transitory computer readable medium of claim 14, further comprising:
computer program code for saving the identifier of the test cycle as a bit word or a numerical value.

19. The non-transitory computer readable medium of claim 14, further comprising:
computer program code for reading out the stored stump data and the identifier of the test cycle that caused the IC device to fail via an interface of the IC device.

20. The non-transitory computer readable medium of claim 19, further comprising:
computer program code for performing circuit simulation analysis using the stored stump data and the identifier of the test cycle that was read out from the interface of the IC device.

* * * * *